United States Patent [19]
Mak et al.

[11] Patent Number: 5,696,441
[45] Date of Patent: Dec. 9, 1997

[54] LINEAR ALTERNATING CURRENT INTERFACE FOR ELECTRONIC METERS

[75] Inventors: Sioe T. Mak, Chesterfield; Brian C. Ramey, University City, both of Mo.

[73] Assignee: Distribution Control Systems, Inc., St. Louis, Mo.

[21] Appl. No.: 242,597

[22] Filed: May 13, 1994

[51] Int. Cl.$^6$ ............................. G01R 15/08; G01R 1/20
[52] U.S. Cl. ................................. 324/115; 324/127
[58] Field of Search ............................. 324/127, 142, 324/115

[56] References Cited

U.S. PATENT DOCUMENTS

| | | | |
|---|---|---|---|
| 3,226,641 | 12/1965 | Miller | 324/142 |
| 4,491,790 | 1/1985 | Miller | 324/142 |
| 4,658,238 | 4/1987 | Mak | 340/310 |
| 4,914,418 | 4/1990 | Mak et al. | 340/310 |
| 4,918,422 | 4/1990 | Mak | 340/310 |
| 4,963,853 | 10/1990 | Mak | 340/310 |
| 4,996,513 | 2/1991 | Mak et al. | 340/310 |
| 5,053,697 | 10/1991 | Carnel et al. | 324/142 |
| 5,128,611 | 7/1992 | Konrad | 324/142 |
| 5,198,796 | 3/1993 | Hessling, Jr. | 340/310 |
| 5,262,755 | 11/1993 | Mak et al. | 340/310 |
| 5,298,857 | 3/1994 | Voisine et al. | 324/142 |

*Primary Examiner*—Ernest F. Karlsen
*Attorney, Agent, or Firm*—Polster, Lieder, Woodruff & Lucchesi

[57] ABSTRACT

An interface circuit (10) for use with electronic metering equipment (E) to provide a linear output response to an AC or analog input. An air core transformer (12) has a first coil or winding (12a) connected to a load (L). An AC current $I_{LOAD}$ is produced by the load and is coupled to a secondary coil or winding (12b) of the transformer. The transformer has an air core rather than a ferromagnetic core so to have no saturable core. Because no load is drawn by transformer coil, the voltage across a terminal of the coil equals the EMF induced in the coil. The EMF, in turn, equals the mutual inductance of the coils multiplied by the rate of change of magnetic flux linkages over time. The output from the transformer is applied as an input to an operational-amplifier (16) which has a high input impedance. Further, the amplifier is a low drift amplifier which performs a linear amplification of the input signal provided thereto. In certain embodiments, a pair of similar amplifiers are used and the secondary winding of the transformer is a tapped winding so to accommodate both a low range and a separate high range of inputs. The output from the operational amplifier is supplied to an analog-to-digital converter (18) so a digital output is supplied to the metering equipment. If the tapped coil, dual amplifier arrangement is used, the resolution requirements of the converter are lower than if the single amplifier circuit configuration is used. Use of the interface circuit eliminates the DC component of the sensed voltage and provides a linear response for the metered AC input to the measuring equipment.

8 Claims, 3 Drawing Sheets

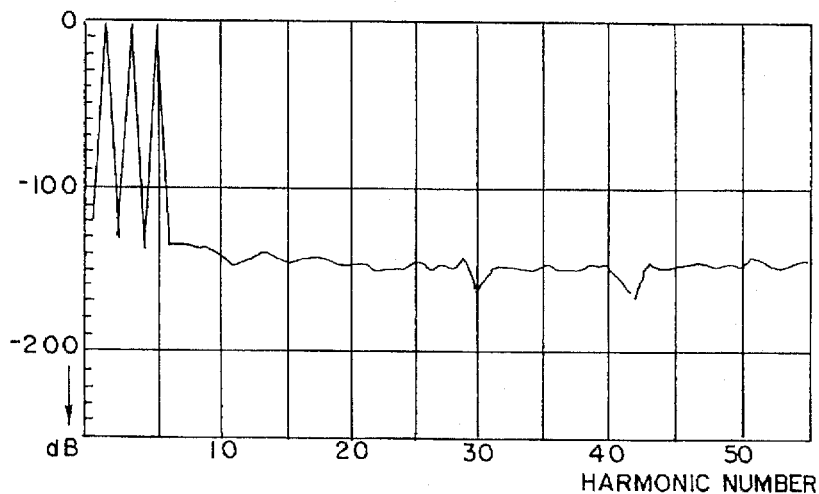
FIG. 4.
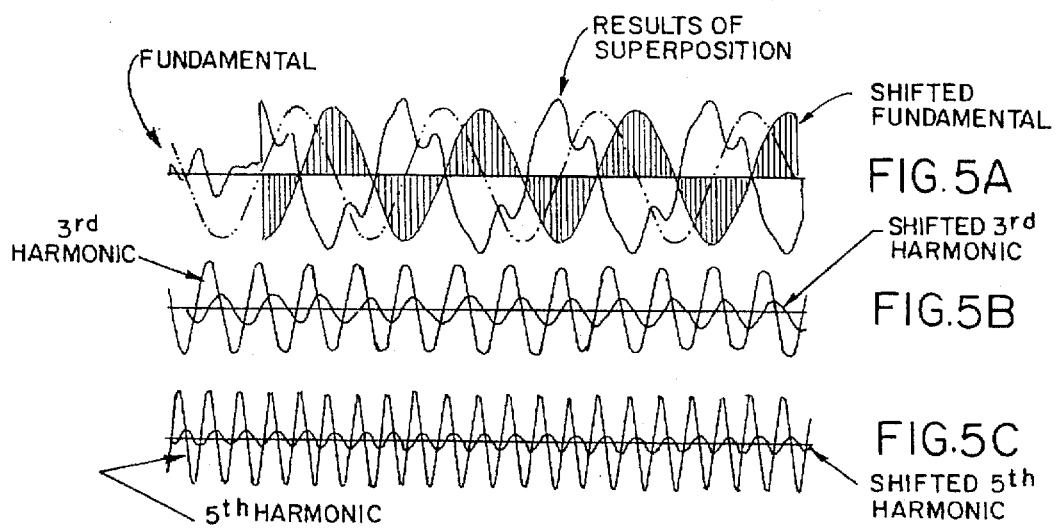
FIG. 5A
FIG. 5B
FIG. 5C
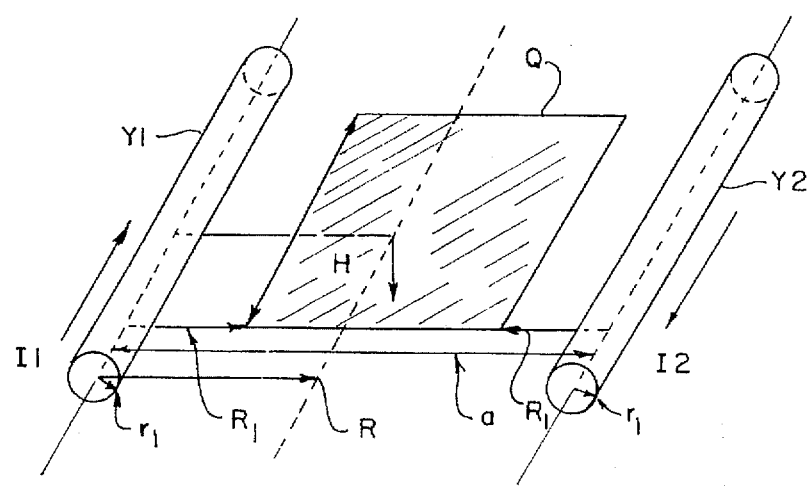
FIG. 6

LINEAR ALTERNATING CURRENT INTERFACE FOR ELECTRONIC METERS

BACKGROUND OF THE INVENTION

This invention relates to electronic metering and, more particularly, to an alternating current (AC) interface circuit which provides a linear current response when connected to an AC load. The circuit is for use with electronic meters to simplify operation of metering circuits. A method for implementing such a circuit is also disclosed.

In measurement systems for many, varied applications in which AC loads are monitored, AC signals are to be measured to obtain relevant information. In such applications, it is known to use a transformer such as a step-down ferromagnetic core transformer to convert a high level AC signal, which could damage the measuring equipment, to a lower level AC signal which can be measured to produce appropriate information for the user without damaging the monitoring/test equipment. A drawback with using the standard transformers typically available for this purpose is that they are physically large units, having non-linear transformation characteristics, and poor frequency response. The non-linearity of their response greatly complicates the operation of the measuring equipment since the equipment must employ other circuitry to manipulate the output signals from the transformer and provide a measurable signal. That is, compensation circuits, or circuits which produce some type of linearity for the transformer output must be employed to develop a signal which is processed to provide the measurement information. The above noted non-linearity results because the core of the transformer becomes saturated. Also, at higher frequencies, the various impedance levels within the transformer become significant.

Accordingly, it would be helpful to be able to provide an interface between the system being monitored and the test equipment which alleviates these problems so accurate measurements can be readily made using a simpler test configuration. In this regard, digital signal processor (DSP) chips are now available at low cost. DSP's are programmed, or programmable to provide a wide variety of signal processing functions. As such, they can be readily incorporated in electronic metering equipment to process inputs to obtain any of a desired range of significant information which can be derived from the input. This is significant because it allows a user, if he can provide an appropriate input for processing to greatly increase the level of control over a using system.

SUMMARY OF THE INVENTION

Among the several objects of the present invention may be noted the provision of an interface circuit for use with electronic metering equipment monitoring AC loads; the provision of an interface circuit to provide a linear response to an AC input thereby to simplify making of a measurement; the provision of such an interface circuit to transform a complex input signal into a signal having no DC component and an AC component whose response is linear over a wide range of signal frequencies; the provision of such an interface circuit employing an air core transformer and a high-impedance, low drift linear amplifier to produce the linear response; the provision of such an interface circuit by which the input to the amplifier is on the order of 5 mv. for a load current of 1 amp, and approximately 1 v. at a load current of 200 amps so that the response is not only linear, but is a low level input which is readily measured by the metering equipment without the risk of damage; the provision of such an interface circuit to also employ an analog-to-digital converter (ADC) for the circuit to provide a digital output signal to the measuring equipment; the provision of an interface circuit to utilize a tapped or dual pickup coil arrangement in an air core transformer to improve the accuracy of measurements by providing both a low range and a high range of values; the provision of such a tapped or dual coil arrangement which reduces the resolution required for any analog-to-digital (A/D) conversions made as part of measuring a particular parameter so to increase conversion speed of the A/D conversion performed; the provision of such an interface to enable highly accurate readings to be made by the test equipment; and, the provision of such an interface which is low cost and usable with current, state-of-the-art digital signal processing equipment already implemented in many digital devices. The present invention further includes the provision of a method by which the mutual inductance of the coils are determined so no load is drawn from the coils; the provision of such a method by which the electro-motive force (EMF) induced in the coils is a function of the mutual inductance of the transformer coils including the rate change of magnetic flux linkage over time; the provision of such a method by which flux linkage is proportional to the current regardless of the current magnitude; the provision of such a method by which the flux linkage is linearly proportional to the current; the provision of such a method by which the number of bits required of an A/D converter to perform conversions is minimized to facilitate circuit speed and reduce converter cost; and, the provision of such a method by which a simple, easy to use interface circuit is provided for use with state-of-the-art processing equipment. Also, the present invention enables a user to not only eliminate the DC component of a complex input signal, but to also perform a Fourier transform of the resultant AC signal so that the base frequency of the AC component of the input signal, as well as the harmonic frequencies of the signal can be made available for processing to obtain information relating to the system from which the input is obtained. The present invention envisages use of digital signal processing devices by which Fourier transforms of the AC component of an AC input are readily obtained for further processing.

In accordance with the invention, generally stated, an interface circuit is for use with electronic metering equipment to provide a linear output response to an AC signal developed across a load. An air core transformer has a primary winding connected across a load. An AC current signal is developed by the load and is coupled to a secondary winding of the transformer. The transformer has an air core rather than a ferromagnetic core, the air core not being a saturable core. The output from the transformer is applied as an input to an operational-amplifier (op-amp) having a high input impedance. The transformer is designed to provide a linear response to a wide range of input signals applied to the primary winding so the output applied from the transformer to the op-amp is directly proportional to the input signal. The amplifier is a low drift amplifier which performs an amplification of the input signal provided thereto. In certain embodiments, a pair of similar amplifiers are used and the secondary winding of the transformer is a tapped winding. This allows the interface circuit to provide inputs to the amplifiers in a respective low range and high range. The output from the operational amplifier is supplied to an analog-to-digital converter so a digital output is supplied to the metering equipment. A method of implementing an interface circuit providing a linear response is also disclosed, 5,696,441 as is a method of processing a complex input signal to eliminate the DC component of the signal as well as produce harmonics of the signal for subsequent additional processing. Other objects and features will be in part apparent and in part pointed out hereinafter.

BRIEF DESCRIPTION OF THE DRAWINGS

FIG. 4 is a curve for a Discrete Fourier Transform of the curve of FIG. 3, the transform being for a waveform having a first frequency with the curve representing data from samples taken at a second and higher frequency;

FIG. 5A represents both a curve of the fundamental frequency of the current curve of FIG. 3, and a curve representing the fundamental frequency when divided by a harmonic number and shifted by 90°;

FIG. 5B is a plot similar to FIG. 5A but for the third harmonic, and FIG. 5C is a similar plot for the fifth harmonic;

FIG. 6 is an illustration of one method for determining mutual inductance between the primary and secondary coils or windings of an air core transformer used in the circuit;

Corresponding reference characters indicate corresponding parts throughout the several views of the drawings.

DESCRIPTION OF PREFERRED EMBODIMENTS

Figure 1:
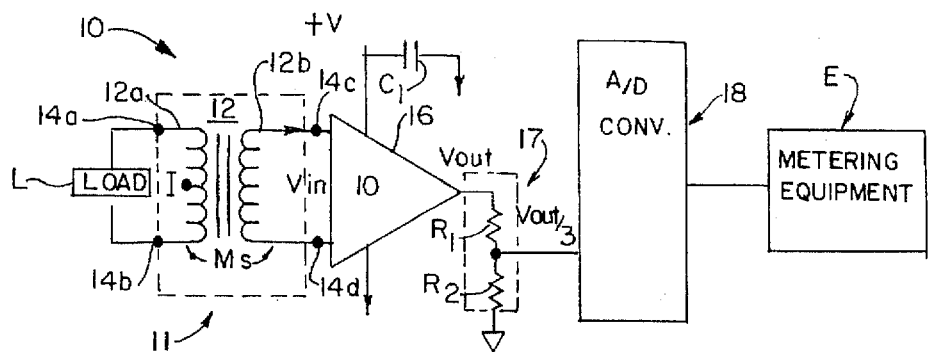
FIG. 1 is a schematic diagram of an interface circuit of the present invention for use with measuring equipment for measuring a digital signal input.

Referring to the drawings, an alternating current interface circuit of the present invention for use electronic metering equipment is indicated generally generally 10 in FIG. 1. It is a feature of the circuit, as described herein, to provide a linear response. Interface circuit 10 includes a coupling means 11 comprising a transformer 12 having primary and secondary coils or windings 12a and 12b respectively. Winding 12a has associated terminals 14a, 14b across which are connected a load L. A current $I_{LOAD}$ is produced by this load. It will be understood that the load represents of a number of different types of loads which may simple or complex loads. The other transformer winding 12b has associated terminals 14c, 14d. Importantly, transformer 12 is an air core transformer rather than a standard type transformer having a ferromagnetic core. Transformer winding 12b is coupled to the magnetic field generated by flow of the load current $I_{LOAD}$ through the transformer's primary winding. When there is no load on this winding, the voltage across the winding terminals 14c, 14d approximates the induced electromotive force (EMF) in the coil. This EMF, in turn, equals the mutual inductance $M_s$ of the coil times the negative rate of change of the magnetic flux linkage $\Psi$ over time. It will be understood that this flux linkage is proportional to the current i. Because no saturable material is used in the transformer; i.e., because it is an air core rather than a ferromagnetic core transformer, the flux linkage remains linearly proportional to current regardless of the magnitude of the current. If transformer 12 were a ferromagnetic core transformer, the effects of saturation would have to be factored into the calculations which follow and there would be a non-linearity which would make operation of the interface circuit impractical. In particular, it is of interest to eliminate the effects of the DC component in the input, the DC portion of a signal applied to a conventional transformer having a ferromagnetic core helping produce the undesirable saturation and its effect on response linearity.

To better understand operation of interface circuit 10, the relationship between the flux linkage and current is:

$$\Psi = k * i \quad (1)$$

where k is a proportionality factor based upon a transformer's geometry and the permeability of the material used in the transformer. The value of the EMF ($e_s$) induced in the transformer is given as:

$$e_s = -d\Psi/dt = -M_s di/dt \quad (2)$$

While value $e_s$ represents the voltage obtained from the transformer, it is important to obtain the current. This is done by performing an integration. If the above expression is integrated, the value of current over time i(t) is found to be:

$$i(t) = -1/M_s \int e_s dt \quad (3)$$

It is important to note that the current signal will now have no DC component, only an AC signal represented by a base frequency and harmonics of the base frequency.

For interface circuit 10, the output of winding 12b is applied to an operational amplifier (op-amp) 16. Op-amp 16 is supplied an operating voltage +V. A capacitor C1 is connected in parallel with the voltage source and the op-amp's supply voltage input terminal. The output of op-amp 16 ($V_{out}$) is provided to a voltage divider network 17 comprising resistors R1, R2. The output from the network is supplied as an input to an analog-to-digital converter (ADC) 18. The voltage divider network is designed such that the input to the ADC is one-third, for example, the magnitude of the outout from the op-amp. That is, $V_{in}(ADC) = V_{out}(op\text{-}amp)/3$. This scaling factor of three is provided for reasons to be described hereinafter. The digital output from the ADC is provided to appropriate measuring equipment E. It is important to understand that interface circuit 10 is usable exclusively with loads having AC currents. Any direct current (DC) constituent of a load current is eliminated. By eliminating the DC component, the average net current should be zero. By providing a linear response to AC load currents, interface circuit 10 allows the measuring equipment to be simpler than it would otherwise have to be. Compensation circuits or methodologies by which the measuring equipment will provide a linear response are not necessary when circuit 10 is used with the equipment.

The expression for a current i, including both its DC and AC components is a Fourier series which is set forth as:

$$i(t) = I_{dc} + i_1 \sin(\omega_1 t + \phi_1) + i_2 \sin(\omega_2 t + \phi_1) + \ldots + i_{n-1} \sin(\omega_{n-1} t + \phi_{n-1}) + i_n \sin(\omega_n t + \phi_n). \quad (4)$$

The EMF in a winding 12a or 12b equals the product of the coils' mutual inductance $M_s$ and the derivative of current with respect to time. A negative of the value for EMF is then:

$$e = i_1 \omega_1 M_s \cos(\omega_1 t + \kappa_1) + i_2 \omega_2 M_s \cos(\omega_2 t + \kappa_2) + \ldots + i_{n-1} \omega_{n-1} M_s \cos(\omega_{n-1} t + \kappa_{n-1}) + i_n \omega_n M_s \cos(\omega_n t + \kappa_n) \quad (5)$$

Using the identity:

$$\cos(\omega t + \phi + \pi/2) = -\sin(\omega t + \phi), \quad (6)$$

the various constituents set forth in expression (4) above can be identified. This is done as follows:

a) for any $k^{th}$ term in equation (4), divide the term by k;

b) shift the result by a +90°, and, c) multiply this result by −1.

When this is done, it will be found that the only part of expression (4) which is not recoverable is the DC component. Now, Discrete Fourier Transforms (DFT's) can be used to find the respective harmonic component values and phase angle of i.

Figure 3:
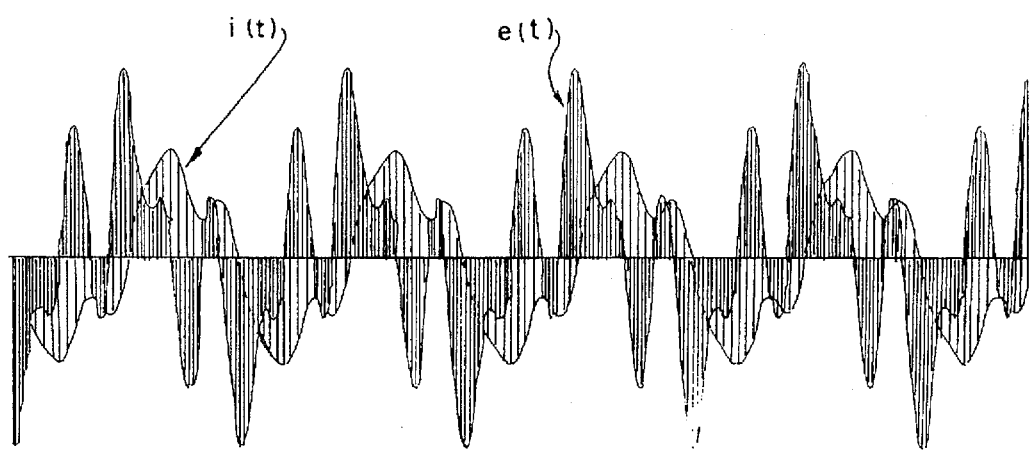
FIG. 3 is a graph representing both the current i(t) and EMF e(t) curves for a selected set of parameters and includes the fundamental frequency of the waveform, and the third and fifth harmonics of the fundamental frequency.

Referring to FIG. 3, an exemplary current waveform for a current i(t) and a resultant EMF curve e(t) are depicted. The curve i(t) includes the fundamental frequency as well as both the third harmonic and fifth harmonic components. The curve e(t) is derived in accordance with the steps a) and b) as set forth above. The respective curves can be expressed as:

$$i(t) = 100 \sin(\omega t) + 25 \sin(3\omega t - 1.5) + 75 \sin(5\omega t - 0.3); \quad (7a)$$

and $$e(t) = 100 \cos(\omega t) + 75 \cos(3\omega t - 1.5) + 75 \cos(5\omega t - 0.3) \quad (7b)$$

FIG. 4 represents a spectral distribution curve of the DFT of the waveform obtained from equation 7b. If the fundamental frequency is, for example 60 Hz, and the sampling rate is 4320 Hz. The following table sets forth the harmonic number, relative strength, and phase angle as shown in the curve of FIG. 4.

| Harmonic | Strength | Phase angle |
|---|---|---|
| 0 | 0.00 | 0.000 |
| 1 | 100.00 | −0.000 |
| 2 | 0.00 | −0.970 |
| 3 | 75.00 | −1.500 |
| 4 | 0.00 | −0.374 |
| 5 | 75.00 | −0.300 |
| 6 | 0.00 | −1.182 |
| 7 | 0.00 | −0.886 |
| 8 | 0.00 | −0.537 |
| 9 | 0.00 | 0.377 |
| 10 | 0.00 | −0.902 |
| 11 | 0.00 | 1.398 |
| 12 | 0.00 | 0.464 |
| 13 | 0.00 | −1.029 |
| 14 | 0.00 | −0.327 |
| 15 | 0.00 | 0.866 |
| 16 | 0.00 | 1.035 |
| 17 | 0.00 | 0.081 |
| 18 | 0.00 | 1.570 |
| 19 | 0.00 | −1.399 |
| 20 | 0.00 | −0.555 |

Referring to FIGS. 5A–5C, FIG. 5A illustrates both the fundamental frequency and shifted fundamental frequency of the curve i(t) in FIG. 3. FIG. 5B is a similar illustration for the third harmonic of the i(t) curve; and, FIG. 5C is a similar illustration for the fifth harmonic. It will be appreciated that if FIGS. 5A–5C are superimposed upon each other, the current curve i(t) of FIG. 1 will be produced. Consequently, the integration $$i(t) = -1/M_s \int e_s dt,$$

as set forth in equation (3), has been accomplished by performing the following steps in sequence:

a) dividing the current expression by $(e/\omega_1)M_s$;

b) carrying out a Discrete Fourier Transform on the result of the above step;

c) dividing the spectral strength of each harmonic by its harmonic number, i.e., dividing the resulting expression for the third harmonic by three; and, d) performing a phase shift of the result of the above step, the phase shift being π/2 or 90°.

For interface circuit 10 to be capable of determining the original current, it must be capable of a) generating each harmonic of the fundamental current; i.e., producing the curves of FIGS. 5A–5C; and, b) performing the superimposition of these curves to produce the curve of FIG. 3.

Referring now to FIG. 6, for interface circuit 10 to be practical, the mutual inductance $M_s$ between transformer windings 12a and 12b must be determined. The method of the present invention includes making this determination. One way to determine mutual inductance is to assume a square coil Q which is comprised of a thin wire. The length of the coil on each side is 1, and the surface area of the coil is equal to A. The coil is positioned equidistantly between parallel, cylindrical conductors Y1, Y2. The plane of the coil is assumed to coincide with that of the conductors. Each conductor has a radius $r_1$, and the distance between the longitudinal centerline of the conductors is a. The distance from the longitudinal centerline of each conductor to the longitudinal centerline of the coil is R. Further, the distance from the longitudinal centerline of each conductor to the adjacent edge of coil Q is a distance $R_1$. A current $I_1$ flows in conductor Y1, and a current $I_2$ flows in conductor Y2. The currents flow in opposite directions. Given these current conditions, the magnetic field H, and magnetic flux crossing the surface area of coil Q due to the flow of current $I_1$, are:

$$H = I_1/2\pi R, \quad (8a)$$

or $$\phi = \mu_o H A, \quad (8b)$$

where $\mu_o$ is permeability.

Expression (8b) can also be written as:

$$\phi = \int (\mu_o I_1 l/2\pi) R \, dR, \quad (8c)$$

where the limits of integration are from $-R_1$ to $R_1$.

For the total current $I_t$ (which is equal to currents $I_1 + I_2$), the total magnetic flux $\phi_t$ across the surface area of the coil is calculated according to the expression:

$$\phi_t = ((\mu_o(I_1 + I_2) l/2\pi) \ln((a - R_1)/R_1)). \quad (9)$$

Next, assume that the number of turns of coil Q enclosing area A is N. For this condition, the total flux linkage is:

$$\psi = ((\mu_o N I_t l/2\pi) \ln((a - R_1)/R_1)). \quad (10a)$$

The mutual inductance $M_s$ can then be expressed as:

$$M_s = \psi/I_t, \quad (10b)$$

or $$M_s = (\mu_o N l/2\pi) \ln((a - R_1)/R_1). \quad (10c)$$

Free space permeability, in MKS units, is $4\pi \cdot 10^{-7}$ Henries/meter. Substitution this value into equation (10c) produces the expression:

$$M_s = lN/5 \ln((a - R_1)/R_1) \mu H. \quad (11)$$

In this expression, l, a, and $R_1$ are in meters.

As an example of how inductance is determined with the foregoing relationships, assume N is 500 turns, a and l are each 5 cm., and $R_1$ is 0.5 cm. Substituting these values into equation (11) produces a calculated mutual inductance of approximately 11 microhenries; e.g., 10.986 μH. Further, if the load current $I_{LOAD}$ is 200 amps (RMS) at 60 Hz., the calculated induced EMF is approximately 1.17 v. I.e.:

$$e=(377)(200)(\sqrt{2})(10.986*10^{-6})=1.1714 \text{ v, where}$$

The value 377 is equal to $2\pi$ times 60 Hz.

What has now been accomplished is replacing of the integration required to convert from the value $e_s$ to the expression for i(t) without having to integrate the expression for $e_s$. As noted, integration; or, in accordance with the method of the invention, performing the Fourier transform to produce the base or fundamental frequency of the signal, as well as the harmonics, achieves the same result in filtering or the DC component of the complex signal input. The steps required to execute the method can be performed using a digital signal processor or DSP. The DSP chip is programmed, or can be programmed, to divide the current expression by $(e/\omega_1)M_s$, performing the discrete Fourier transform, dividing the spectral strength of each harmonic by its harmonic number, and performing the 90° phase shift of the result.

Figure 7:
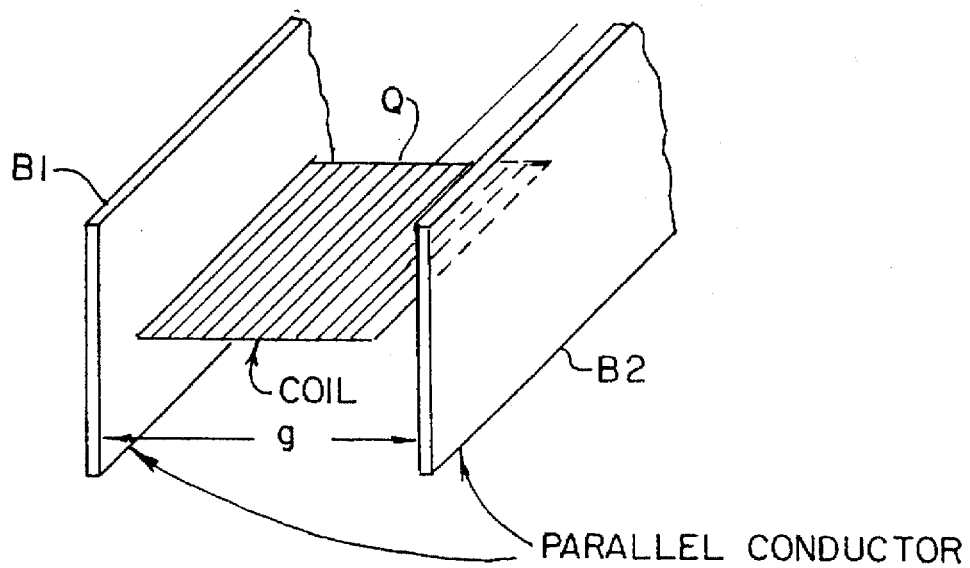
FIG. 7 is an illustration of a second method of determining the mutual inductance; and, FIG. 8 is a diagram useful with the method of FIG. 7 for determining flux linkages in the transformer coil.
Figure 8:
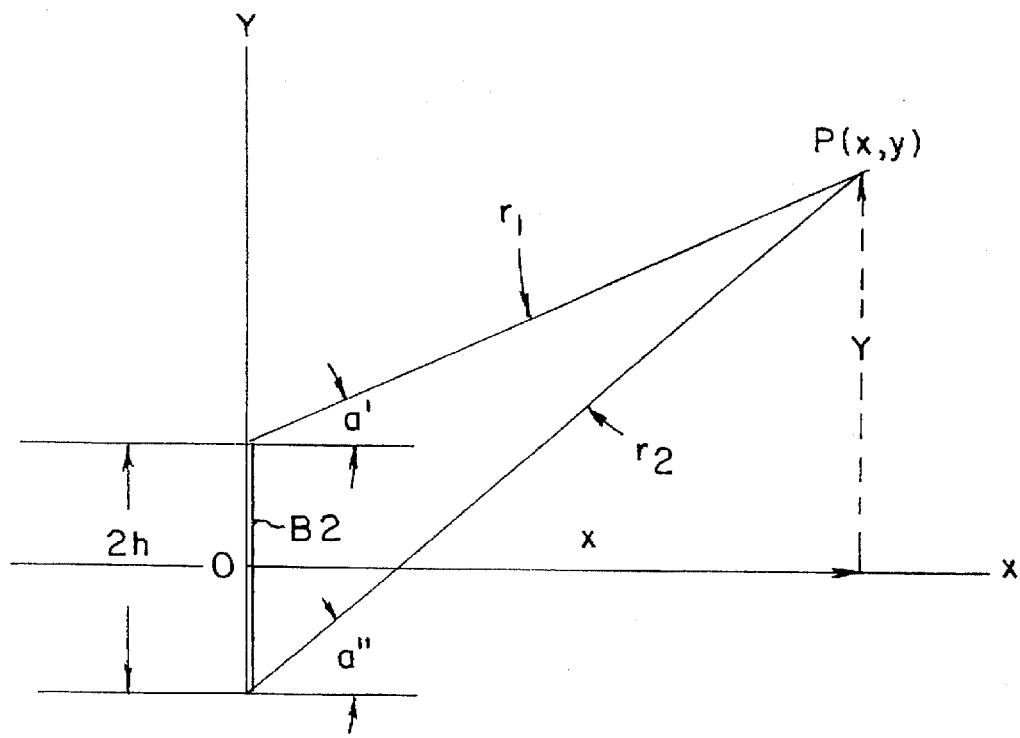

Referring to FIGS. 7 and 8, rather than having coil Q positioned between conductors Y1, Y2, the coil could be positioned between parallel bars or current carrying ribbons B1, B2. Again, the length of the coil on each side is l, and the surface area of the coil is equal to A. The height of each bar is 2h, and the distance between the bars is g. If the abscissa or y axis of a graph coincides with one of the bars, and the ordinate or x axis bisects the bar so that the bar extends a distance h on each side of the x axis, a point P located in space at some point from the bar will have co-ordinates P(x,y). This is as shown in FIG. 8. The linear distance from point P to the nearest point of the bar is a distance $r_1$, and the linear distance to the farthest point is a distance $r_2$. The angle between a line representing the distance $r_1$ and the horizontal is $\alpha_1$, and that between a line representing the distance $r_2$ and the horizontal is an angle $\alpha_2$.

For this geometric relationship, the magnetic vector potential A, in the axial direction, with a current I flowing through the bars, is:

$$A_z=(\mu_o/2\pi)(I/2h)[(y-h)(\ln r_1/h)-(y+h)(\ln r_2/h)+x(\alpha_2-\alpha_1)]. \quad (12)$$

In addition, the respective magnetic field vectors $B_x$ and $B_y$ are calculated as follows:

$$B_x=-(\delta A_z/\delta y), \quad (13a)$$

or $$B_x=-(\mu/2\pi)(I/2h) \ln r_2/r_1. \quad (13b)$$

And, $$B_y=-(\delta A_z/\delta x), \quad (13c)$$

or $$B_y=-(\mu/2\pi)(I/2h)(\alpha_2-\alpha_1) \quad (13b)$$

If coil Q is positioned as shown in FIG. 8; i.e., with its center at x=0, y=0, there is no contribution to the flux in the x direction, so $B_x$=0. Further, the expression for the component in the y direction can be reduced to $$B_y=(\mu_o I/4h)-(\mu_o I/2\pi h)\text{arc tan }[x/h]. \quad (14)$$

If coil Q fits snuggly between bars B1, B2, then for one bar to carry the current I, the enclosed flux ϕ can be calculated as:

$$\phi=\int B_y dx, \quad (15a)$$

with the respective lower and upper limits of integration being 0 and a. Accordingly, $$\phi=(\mu_o Ila/4h)-(\mu_o Il/2\pi h)|x\text{*arc tan }x/h-h/2 \ln (1+a^2/h^2)|_o^a. \quad (15b)$$

After performing the integration, the preceding expression becomes;

$$\phi=(\mu_o Ila/4h)-(\mu_o Il/2\pi h)[a\text{*arc tan }a/h-h/2 \ln (1+a^2/h^2)]. \quad (15c)$$

Employing this relationship in the same manner as with the previous example, the mutual inductance $M_s$ for a coil Q of N turns is:

$$M_s=(\mu_o Nla/4h)-(\mu_o Nla/2\pi h)\text{arc tan } (a/h-(\mu_o Nl/4\pi) \ln (1+a^2/h^2)(16)$$

Referring again to FIG. 1, with the coil design of transformer 12 in accordance with either of the above described examples, op-amp 16 is, as noted, a high input impedance op-amp. Further, the op-amp is a low drift amplifier having linear operating characteristics. From the previous discussion, it will be understood that the voltage input $V_{in}$ to op-amp 16 will range between, for example, 5.85 mv. to 1.17 v. The lower voltage occurs at a load current of 1 amp, and the higher voltage at a load current of 200 amps. For this wide range of input voltage values, the drift in the output voltage $V_{out}$ is less than 1%. Op-amp 16 is, for example, a model LT1101 precision, micropower instrumentation amplifier having a fixed gain of either 10 or 100. The overall gain error (Ge) of the amplifier is 0.04% maximum. Gain drift (Gdr) is on the order of 4 parts per million (ppm). The input voltage to the amplifier has an offset (Vos) which is 160 μV. The amplifier further has an input bias current (Ib) of 8 nA., and the supply current to the amplifier is 105 μA.

For the circuit configuration of FIG. 1, the percentage of total error is a function of both a steady state offset error (ERoff), and drift error (ERdr). The steady state offset error is given by the expression:

$$ERoff=Ge+Vos, \quad (17)$$

where Ge is the op-amp gain error. If the lowest input coil voltage is the 5.85 mv. level discussed above, a worst case offset error (referenced to Vout) can be calculated to be less than ±3.4%. With appropriate calibration, this error can also be eliminated.

Next, the drift error ERdr(max), referenced to the input of the op-amp, can be determined. This is done as follows:

$$Vout(max)=Vin\text{*}Gdr, \quad (18a)$$

$$Vin=Vcoil(@1 A.)+Zcoil(Ib)+Vin(\text{offset max.}), \quad (18b)$$

where Zcoil is the coil impedance.

Given the above relationships and inserting the appropriate values, Vin is found to be 5.88 mv. Further, Vout(max) is found to be 58.84 mv. ERdr(max) is now determined by the equation:

$$ERdr(max)=((1.0-(10)(Vin))/Vout(max))\text{*}100. \quad (18c)$$

Using the respective values for Vin and Vout(max), the maximum drift error is calculated to be ±0.4%.

The total output voltage range for op-amp 16 extends from 58.5 mV. at 1 amp, to 11.71 V. at 200 amps. For an ADC operation to be practical, the output from the op-amp is scaled down. This scaling is provided by the voltage divider network 17 shown in FIG. 1; and, as previously mentioned, the scaling factor is three. With the voltage divider network scaling down $V_{out}$(op-amp) by a factor 3, the input range of the voltages supplied to ADC 18 ranges from 19.5 mV. to 3.9 V. If worst case accuracy is 1%, which occurs at a 3 amp load, the accuracy of the current channel is on the order of 0.5%. If $V_{out}$(op-amp) at 3 amps is 58.5 mV., and the accuracy of the current channel is 0.5%, then the accuracy of the ADC is approximately 0.29 mv. For an ADC 18 having a 5V. full scale range, the resolution of the ADC is approximately 1 in 17000. Since $2^{14}$ equals 16,384, and $2^{15}$ equals 32,768, the resolution of the ADC should be 15 bits.

Figure 2:
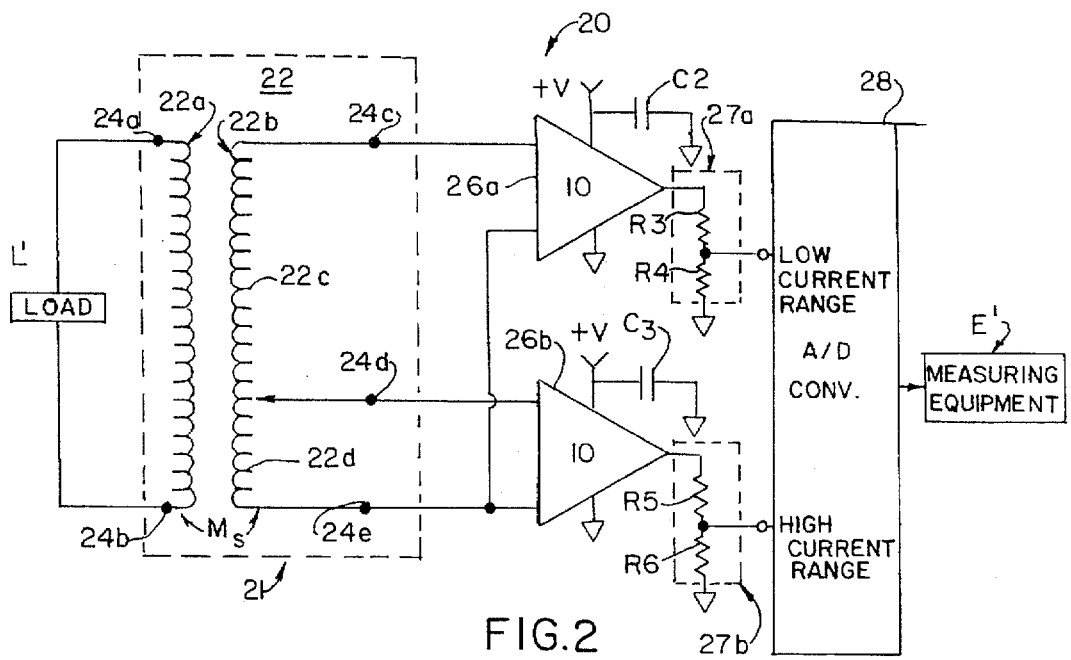
FIG. 2 is a schematic diagram of an alternate embodiment of the interface for providing inputs to the measuring equipment in more than one data range.

Referring to FIG. 2, an alternate embodiment of the interface circuit of the present invention is indicated generally 20. Circuit 20 includes a coupling means 21 comprising an air core transformer 22 having respective windings 22a, 22b. Winding 22a has respective terminals 24a, 24b, and a load L' is connected to the transformer across these windings. There is a mutual inductance $M_s$ between the windings; and, this inductance together with the other parameters required to design an air core transformer in accordance with the teachings of the present invention are as previously described. Next, circuit 20 includes a pair of operational amplifiers 26a, 26b which are also model number LT1101 op-amps. Each op-amp has an associated capacitor C2, C3 connected in parallel with the voltage input to the op-amp.

One input to op-amp 26a is connected to a terminal 24c of winding 22b. Winding 22b is a tapped coil with the tap being connected to a transformer terminal 24d. This terminal is connected to the similar input of op-amp 26b as the input to which terminal 24c is connected on op-amp 26a. Also, the other input of each op-amp is commonly connected to a terminal 24e which attaches to the other side of the winding. Each section of winding 22b is optimized for a particular current range. As shown in FIG. 2, the lower portion 22c of winding 22b is for use with load currents of 60 amps, or less, for example. The other section 22d of the coil is for use with load currents of between 60 amps and 200 amps. It will be understood that the respective ranges can be changed by changing the location of the tap.

The output of both op-amps is supplied to an ADC 28. The output of op-amp 26a, the low range output, is supplied to a low range input of the ADC via a voltage divider network 27a comprising resistors R3, R4. The output of op-amp 26b is supplied to a high range input of the ADC through a voltage divider network 27b comprising resistors R5, R6. As before, the voltage divider networks provide the scaling factor (3) for the reasons previously described. The ADC output is supplied to the measuring equipment E'. For this interface circuit configuration, the accuracy required at 3 amps, in the lower range, is 166.67 mv. If the accuracy of the current channel is again 0.5%, the calculated resolution is 1 in 6000. Since $2^{12}$ is 4096, and $2^{13}$ is 8192, a 13 bit converter is used. This is based on a full scale range which is again 5 V. The comparable calculation for the higher range is 1 in 853. Since $2^9$ is 512, and $2^{10}$ is 1024, a 10 bit converter would be used.

The advantage of the interface circuit 20 of FIG. 2 is that the tapped coil technique and dual amplifiers reduces the resolution of the A/D conversion which is performed by the circuit. Implementation of the circuit could require use of a multiplexer and an additional current channel. However, the reduction in resolution achieved by the circuit means a lower cost ADC can be used in the circuit and the conversion will be faster.

What has been described is a linear, alternating current interface for use with electronic metering equipment. The interface employs an air core transformer and a high-impedance, low drift linear amplifier which has, for example, an input of approximately 5 mv. for a load current of 1 amp, and approximately 1 v. at a load current of 200 amps. Accordingly, the response is not only linear, but is a low level input readily measured by the metering equipment. The interface can also utilize a tapped or dual pickup coil arrangement to improve the accuracy of measurements by providing a low range and high range of values. This tapped coil or dual coil arrangement reduces the resolution of any A/D conversions made as part of measuring a particular parameter. This increases the conversion speed of for A/D conversion performed. Use of the interface facilitates readily obtainable, highly accurate readings. The interface is a low cost interface usable with current, state-of-the-art digital signal processing equipment implemented in many digital devices. In accordance with the interface and method of the present invention, a user can readily eliminate the DC component of a complex input signal, and perform a Fourier transform of the resultant AC signal to obtain a signal for processing which includes the base or fundamental frequency of the AC component, as well as the harmonic frequencies of the signal. Performing the Fourier transform achieves the same result as performing an integration of a voltage signal but is done so in a manner by which extensive information is obtained from the results of the operation.

In view of the foregoing, it will be seen that the several objects of the invention are achieved and other advantageous results are obtained.

As various changes could be made in the above constructions without departing from the scope of the invention, it is intended that all the matter contained in the above description or shown in the accompanying drawings shall be interpreted as illustrative and not in a limiting sense.

Having thus described the invention, what is claimed and desired to be secured by Letters Patent is:

1. An interface circuit for use with electronic metering equipment which meters alternating current (AC) parameters comprising:

means for coupling AC current flowing through a load to the electronic metering equipment used to perform the metering, said coupling means being a "no load" air core transformer having a primary coil to which the load is connected and a secondary coil whereby a voltage impressed across input terminals of the primary coil equals a voltage induced in the secondary coil, where the mutual inductance of the transformer is determined in accordance with the expression $$M_s = lN/5 \ln((a-R_1)/R_1) \mu H.$$

and where a coil of the transformer winding is a thin wire, square coil equidistantly positioned between parallel, cylindrical conductors, the plane of the coil coinciding with that of the conductors with current flowing through one conductor in one direction and in the other conductor in the opposite direction, the coil having N number of turns and sides of length "1", the distance between the longitudinal centerline of the conductors being "a", and the distance from the longitudinal centerline of each conductor to the adjacent edge of the coil being $R_1$;

amplifier means to which an AC signal developed by the secondary coils of said means for coupling is supplied, said AC signal being linearly proportional to the AC current flowing through the load, the amplifier means performing a linear amplification of the input provided thereto to produce an AC output signal; and, conversion means responsive to an output signal from the amplifier means for converting the AC signal from the amplifier means to a digital signal supplied to the electronic metering equipment used for metering purposes.

2. The interface circuit of claim 1 wherein the amplifier means includes a low drift amplifier having a high input impedance.

3. The interface circuit of claim 1 wherein the amplifier means includes a second amplifier, the input signals to the amplifier means having a range of values and the input signals supplied to the respective amplifiers being separable into a first range corresponding to a low range of input values and a second range corresponding to an upper range of input values.

4. The interface circuit of claim 3 wherein the secondary coil of the transformer is a tapped coil whereby the coil is divided into a first section and a second section across each of an AC output signal is developed, the respective AC output signals being provided as an input to one of the respective amplifiers, the input to one of the amplifiers being a low range input and the input to the other amplifier being a high range input.

5. The interface circuit of claim 2 wherein an AC output signal of the amplifier is supplied as an input to an analog-to-digital converter to convert the AC signal to a digital output supplied to the electronic measuring equipment.

6. The interface circuit of claim 4 wherein an AC output signal of each respective amplifier is supplied as an input to an analog-to-digital converter to convert the respective low range and high range AC signals to the digital output signal supplied to electronic measuring equipment.

7. The interface circuit of claim 5 further including scaling means for scaling the output signal from the amplifier means supplied to the analog-to-digital converter.

8. The interface circuit of claim 6 further including scaling means for scaling the respective output signals from the amplifier means supplied to the analog-to-digital converter.

* * * * *